United States Patent
Nishimura et al.

(10) Patent No.: US 8,674,210 B2
(45) Date of Patent: Mar. 18, 2014

(54) PHOTOELECTRIC CONVERSION DEVICE AND MANUFACTURING METHOD OF THE SAME

(75) Inventors: Daisuke Nishimura, Higashiomi (JP); Toshifumi Sugawara, Higashiomi (JP); Ken Nishiura, Higashiomi (JP); Norihiko Matsushima, Higashiomi (JP); Yosuke Inomata, Higashiomi (JP); Hisao Arimune, Higashiomi (JP); Tsuyoshi Uesugi, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 13/133,138

(22) PCT Filed: Sep. 29, 2010

(86) PCT No.: PCT/JP2010/066941
§ 371 (c)(1),
(2), (4) Date: Jul. 28, 2011

(87) PCT Pub. No.: WO2011/040461
PCT Pub. Date: Apr. 7, 2011

(65) Prior Publication Data
US 2012/0174957 A1    Jul. 12, 2012

(30) Foreign Application Priority Data

Sep. 29, 2009 (JP) ................... 2009-224269

(51) Int. Cl.
*H01L 31/042* (2006.01)
*H02N 6/00* (2006.01)
*H01L 31/00* (2006.01)
*H01L 21/00* (2006.01)

(52) U.S. Cl.
USPC ........... 136/244; 136/249; 136/262; 136/264; 438/95; 257/E31.004

(58) Field of Classification Search
USPC .................. 136/244, 249, 262, 264
See application file for complete search history.

(56) References Cited

U.S. PATENT DOCUMENTS

| 6,080,928 A * | 6/2000 | Nakagawa ............ 136/249 |
| 2007/0193623 A1 | 8/2007 | Krasnov |

(Continued)

FOREIGN PATENT DOCUMENTS

| CN | 101313411 A | 11/2008 |
| CN | 101326645 A | 12/2008 |

(Continued)

OTHER PUBLICATIONS

Japanese language international preliminary report on patentability dated May 8, 2012 and its English language translation issued in corresponding PCT application PCT/JP2010/066941.

(Continued)

*Primary Examiner* — Jonathan Johnson
*Assistant Examiner* — Angelo Trivisonno
(74) *Attorney, Agent, or Firm* — DLA Piper LLP (US)

(57) ABSTRACT

To provide a photoelectric conversion device having a high photoelectric conversion efficiency, a photoelectric conversion device 21 includes a substrate 1, a plurality of lower electrodes 2 on the substrate 1 comprising a metal element, a plurality of photoelectric conversion layers 33 comprising a chalcogen compound semiconductor formed on the plurality of lower electrodes 2 and separated from one another on the lower electrodes 2, a metal-chalcogen compound layer 8 comprising the metal element and a chalcogen element included in the chalcogen compound semiconductor formed between the lower electrode 2 and the photoelectric conversion layer 33, an upper electrode 5 formed on the photoelectric conversion layer 33, and a connection conductor 7 electrically connecting, in a plurality of the photoelectric conversion layers 33, the upper electrode 5 to the lower electrode 2 without interposition of the metal-chalcogen compound layer 8.

9 Claims, 6 Drawing Sheets

(56) References Cited

U.S. PATENT DOCUMENTS

| | | |
|---|---|---|
| 2008/0119005 A1* | 5/2008 | Weidman et al. ............... 438/95 |
| 2008/0121274 A1 | 5/2008 | Yagiura |
| 2008/0216895 A1 | 9/2008 | Aoki et al. ................... 136/265 |
| 2009/0173382 A1 | 7/2009 | Yagiura |
| 2009/0242022 A1 | 10/2009 | Yonezawa |
| 2009/0277499 A1 | 11/2009 | Aoki et al. |
| 2009/0320895 A1 | 12/2009 | Yagiura et al. |

FOREIGN PATENT DOCUMENTS

| | | |
|---|---|---|
| CN | 101496178 A | 7/2009 |
| EP | 1710844 A1 | 10/2006 |
| JP | 2002-373995 | 12/2002 |
| JP | 2007-317858 | 12/2007 |
| WO | 2008026581 A1 | 3/2008 |

OTHER PUBLICATIONS

Wada et al., "Characterization of the Cu(In,Ga)Se2/Mo interface in CIGS solar cells" Thin Solid Films, vol. 387, No. 1-2, pp. 118-122, May 29, 2001.

Extended European search report dated Oct. 16, 2013 issued in corresponding European application Oct. 16, 2013.

\* cited by examiner

F I G . 1
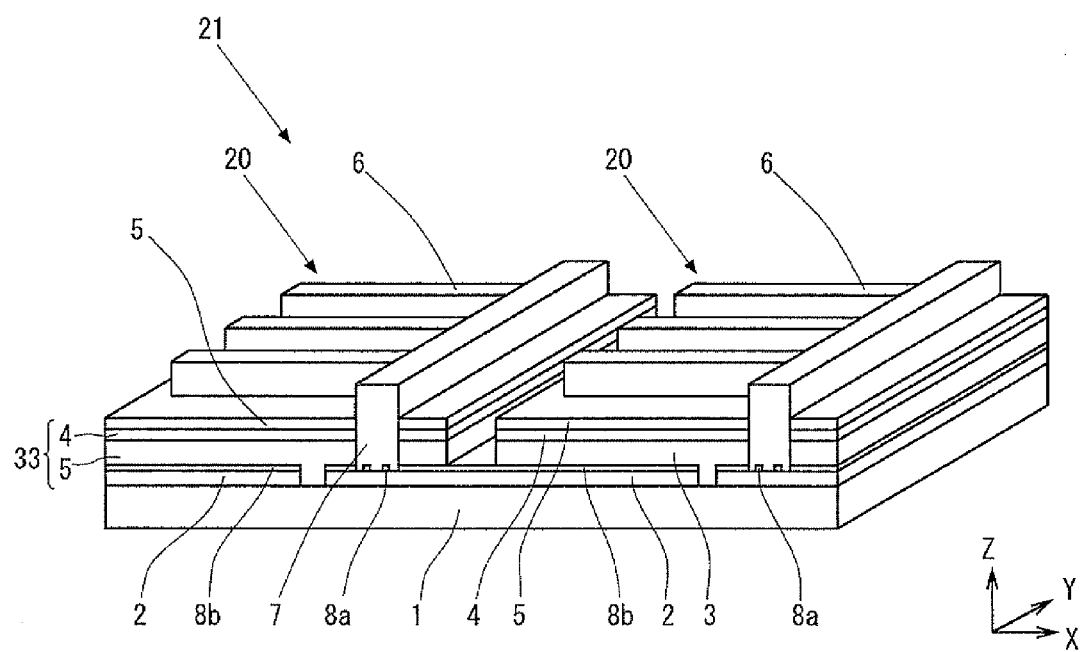

F I G. 2
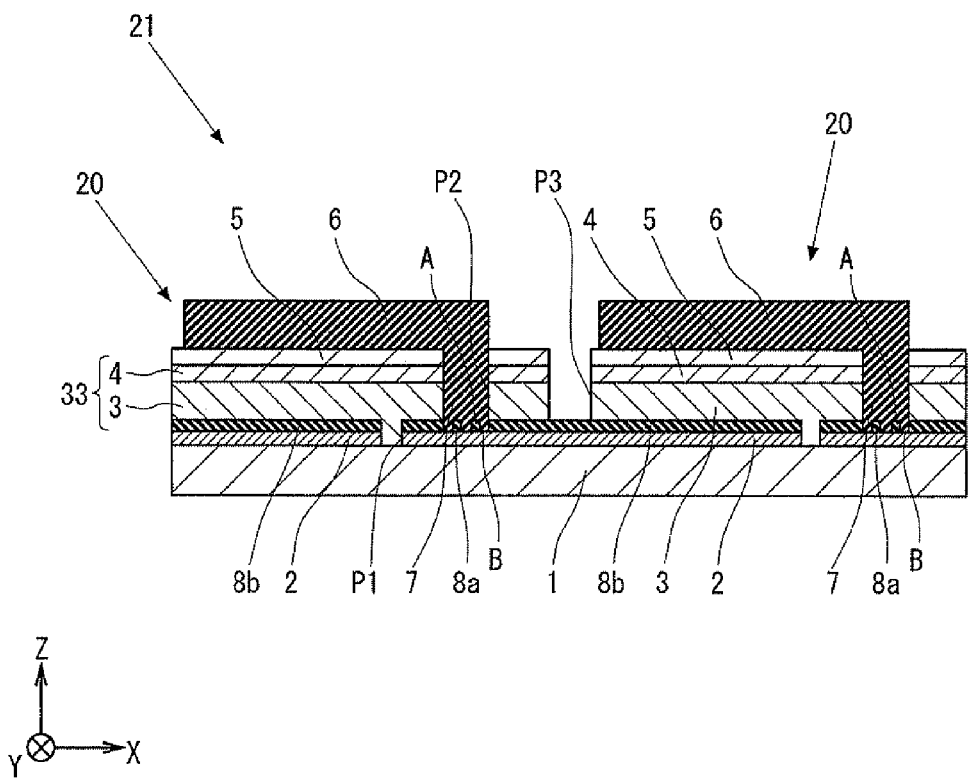

PHOTOELECTRIC CONVERSION DEVICE AND MANUFACTURING METHOD OF THE SAME

CROSS-REFERENCE TO RELATED APPLICATIONS

This application is a national stage of international application No. PCT/JP2010/066941, filed on Sep. 29, 2010, and claims the benefit of priority under 35 USC 119 of Japanese Patent Application No. 2009-224269, filed on Sep. 29, 2009, which are incorporated herein by reference.

TECHNICAL FIELD

The present invention relates to a photoelectric conversion device including a chalcogen compound semiconductor layer, and a manufacturing method therefor.

BACKGROUND ART

There are various types of photoelectric conversion devices used for photovoltaic power generation and the like. A chalcopyrite-based photoelectric conversion device, as typified by a CIS type (copper indium selenide type), easily allows an increase in the area of a solar cell module with a relatively low cost, and therefore research and development thereof have been promoted.

The chalcopyrite-based photoelectric conversion device includes, as a light-absorbing layer, a chalcogen compound semiconductor layer (chalcopyrite-based compound semiconductor layer) made of copper indium gallium diselenide (CIGS) or the like, and, as a buffer layer, a mixed crystal compound semiconductor made of cadmium sulfide or the like. The photoelectric conversion device additionally includes a transparent conductive film serving as an upper electrode provided on the buffer layer. The photoelectric conversion device moreover includes a silver grid electrode provided on the transparent conductive film. In the photoelectric conversion device, the transparent conductive film and the silver grid electrode are also formed in grooves, which are used as a connection conductor. The connection conductor electrically connects an upper electrode of one photoelectric conversion cell to a lower electrode of the other photoelectric conversion cell (for example, see Patent Document 1).

PRIOR-ART DOCUMENTS

Patent Documents

Patent document 1: Japanese Patent Application Laid-Open No. 2002-373995

SUMMARY OF THE INVENTION

Problems to be Solved by the Invention

However, the chalcogen compound semiconductor layer included in the light-absorbing layer is relatively brittle, and therefore peel-off of the light-absorbing layer may occur in processing the grooves, to cause a failure of the connection between the connection conductor and the lower electrode. Such a failure of the connection may cause a deterioration in the photoelectric conversion efficiency of the photoelectric conversion device. Therefore, it is demanded to reduce occurrence of the above-mentioned failure of the connection and improve the photoelectric conversion efficiency of the photoelectric conversion device.

The present invention has been accomplished in view of the problems described above, and an object thereof is to provide a photoelectric conversion device having a high photoelectric conversion efficiency.

Means for Solving the Problems

A photoelectric conversion device according to an embodiment of the present invention comprises a substrate, a plurality of lower electrodes on the substrate comprising a metal element, and a plurality of photoelectric conversion layers comprising a chalcogen compound semiconductor and formed on the plurality of lower electrodes, respectively. This embodiment further includes a plurality of upper electrodes and a connection conductor. The plurality of upper electrodes are formed on the plurality of photoelectric conversion layers, respectively. The connection conductor electrically connects, in neighboring ones of the photoelectric conversion layers, the upper electrode one photoelectric conversion layer to the lower electrode of the other photoelectric conversion layer. Moreover, in this embodiment, the connection conductor comprises a first connection portion and a second connection portion. The first connection portion is connected to the lower electrode through a first metal-chalcogen compound layer comprising the metal element and a chalcogen element included in the chalcogen compound semiconductor. The second connection portion is connected to the lower electrode without interposition of the first metal-chalcogen compound layer.

A method for producing a photoelectric conversion device according to an embodiment of the present invention comprises the steps of: forming a precursor of a chalcogen compound semiconductor on a substrate located thereon with a plurality of lower electrodes comprising a metal element; and heating the precursor to form a first metal-chalcogen compound layer on the lower electrode, and to form a photoelectric conversion layer on the first metal-chalcogen compound layer, the first metal-chalcogen compound layer comprising the metal element and a chalcogen element included in the chalcogen compound semiconductor and the photoelectric conversion layer comprising the chalcogen compound semiconductor. This embodiment further includes the steps of forming an upper electrode on the photoelectric conversion layer; removing the upper electrode, the photoelectric conversion layer, and a part of the first metal-chalcogen compound layer on the lower electrode; and forming a connection conductor so as to connect the upper electrode to the lower electrode. Moreover, in this embodiment, the step of forming the connection conductor comprises forming a first connection portion and a second connection portion, the first connection portion being connected to the lower electrode through the first metal-chalcogen compound layer, the second connection portion being connected to the lower electrode without interposition of the first metal-chalcogen compound layer.

Effects of the Invention

In the photoelectric conversion device and the method for manufacturing the photoelectric conversion device described above, a photoelectric conversion device can be provided having a good connection between the connection conductor and the lower electrode and thus having a high photoelectric conversion efficiency.

BRIEF DESCRIPTION OF THE DRAWINGS

FIG. 1 is a perspective view illustrating an example of an embodiment of a photoelectric conversion device according to the present invention.

FIG. 2 is a cross-sectional view of the photoelectric conversion device of FIG. 1.

EMBODIMENT FOR CARRYING OUT THE INVENTION

Figure 3:
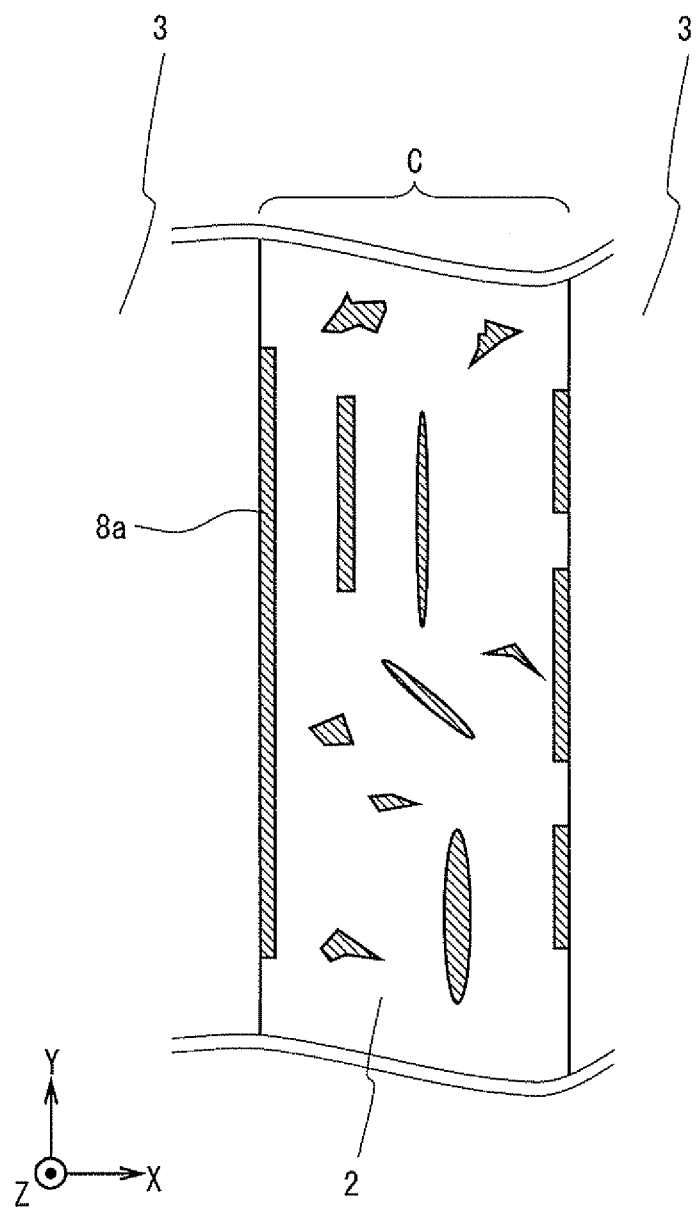
FIG. 3 is a schematic diagram showing an example of a first metal-chalcogen compound layer.

FIG. 1 is a perspective view showing a structure of a photoelectric conversion device according to an embodiment of the present invention, and FIG. 2 is a cross-sectional view thereof. A photoelectric conversion device 21 includes a substrate 1, lower electrodes 2, photoelectric conversion layers 33, upper electrodes 5, connection electrodes 7, first metal-chalcogen compound layers 8a, and second metal-chalcogen compound layers 8b. Although in this embodiment, a case where the photoelectric conversion layer 33 includes a light-absorbing layer 3 and a buffer layer 4 forming a heterojunction thereto is shown as an example, this is not limitative. It suffices that at least a part of the photoelectric conversion layer 33 at the lower electrode 2 side includes a chalcogen compound semiconductor. Therefore, in the photoelectric conversion layer 33, the buffer layer 4 including a chalcogen compound semiconductor and the light-absorbing layer 3 may be put in layers in the mentioned order from the lower electrode 2 side, or semiconductor layers having different conductivity types may form a homojunction with each other. The upper electrode 5 may be a semiconductor layer, or a so-called window layer.

In FIGS. 1 and 2, the photoelectric conversion device 21 has a plurality of photoelectric conversion cells 20 arranged side by side. By the connection conductor 7 provided so as to extend over the light-absorbing layer 3 and the buffer layer 4, the upper electrode of the photoelectric conversion cell 20 is electrically connected to a portion where the lower electrode 2 extends of a neighboring photoelectric conversion cell 20. In other words, the connection conductor 7 electrically connects, in neighboring photoelectric conversion layers 33, the upper electrode 5 of one photoelectric conversion cell 20 to the lower electrode 2 of the other photoelectric conversion cell 20. As a result, the neighboring photoelectric conversion cells 20 are connected in series with each other along an X direction in FIG. 1. In one photoelectric conversion cell 20, the connection conductor 7 is provided so as to extend over the light-absorbing layer 3 and the buffer layer 4, and the light-absorbing layer 3 and the buffer layer 4 interposed between the upper electrode 5 and the lower electrode 2 perform photoelectric conversion.

The substrate 1 serves to support the light-absorbing layer 3 and the like. Examples of the material of the substrate 1 include glass, ceramics, resins, and metals. For example, a blue plate glass (soda-lime glass) having a thickness of approximately 1 to 3 mm may be used for the substrate 1.

A metal such as molybdenum (Mo), aluminium (Al), titanium (Ti), tantalum (Ta) or gold (Au), or a laminated structure of these metals, is used for the lower electrode 2. The lower electrode 2 is formed on the substrate 1 so as to having a thickness of approximately 0.2 to 1 µm by a sputtering method, a vapor-deposition process, or the like.

The light-absorbing layer 3 includes a chalcogen compound semiconductor. The chalcogen compound semiconductor means a compound semiconductor containing a chalcogen element, namely, sulfur (S), selenium (Se), or tellurium (Te). Examples of the chalcogen compound semiconductor include a I-III-VI compound semiconductor and a II-VI compound semiconductor. The compound semiconductor means a compound semiconductor of a group I-B element (also called a group II element), a group III-B element (also called a group 13 element), and a group VI-B element (also called a group 16 element). The compound semiconductor has a chalcopyrite structure, and called a chalcopyrite-based compound semiconductor (also called a CIS-based compound semiconductor). The II-VI compound semiconductor means a compound semiconductor of a group II-B element (also called a group 12 element) and a group VI-B element. From the viewpoint of improving the photoelectric conversion efficiency, the I-III-VI compound semiconductor which is the chalcopyrite-based compound semiconductor may be used.

Examples of the I-III-VI compound semiconductor include copper indium diselenide ($CuInSe_2$), copper indium gallium diselenide ($Cu(In,Ga)Se_2$), copper indium gallium diselenide with sulfur ($Cu(In,Ga)(Se,S)_2$), and copper indium gallium disulfide ($Cu(In,Ga)S_2$). The chalcopyrite-based compound semiconductor may be a multinary compound semiconductor thin film of, for example, copper indium gallium diselenide whose surface layer is formed of a thin film of copper indium gallium diselenide with sulfur layer.

The light-absorbing layer 3 is, for example, a thin film having a thickness of approximately 1 to 3 µm whose conductivity type is p-type. In a case where the light-absorbing layer 3 is formed of the I-III-VI compound semiconductor, the buffer layer 4 for forming a heterojunction may be provided on a surface of the I-III-VI compound semiconductor. For the buffer layer 4, for example, a mixed crystal compound semiconductor such as cadmium sulfide (CdS), indium sulfide (InS), or zinc sulfide (ZnS) may be mentioned.

The second metal-chalcogen compound layer 8b having a metal element contained in the lower electrode 2 and a chalcogen element contained in the light-absorbing layer 3 is provided between the lower electrode 2 and the light-absorbing layer 3. The thickness of the second metal-chalcogen compound layer 8b is approximately 1 nm to 1 µm. From the viewpoint of improving the adhesion between the light-absorbing layer 3 and the lower electrode 2 to obtain a good electrical connection between the light-absorbing layer 3 and the lower electrode 2, the thickness of the second metal-chalcogen compound layer 8b may be set at 5 nm to 200 nm. In a case where, for example, the lower electrode 2 is formed of molybdenum and the light-absorbing layer 3 is a compound semiconductor containing Se, the second metal-chalcogen compound layer 8b is formed of molybdenum selenide ($MoSe_2$). In this embodiment, such a second metal-chalcogen compound layer 8b enables the light-absorbing layer 3 and the lower electrode 2 to adhere to each other with an enhanced strength.

The second metal-chalcogen compound layer 8b can be formed by bringing a feedstock including a gaseous or solid chalcogen element into contact with the lower electrode 2 and performing a heating. From the viewpoint of simplification of steps, it is preferable that during the formation of the light-absorbing layer 3, the second metal-chalcogen compound layer 8b is formed using the chalcogen element which is a feedstock of the light-absorbing layer 3 simultaneously with the formation of the light-absorbing layer 3.

The upper electrode 5 includes a so-called window layer, and it suffices that the Material thereof has an n-type conductivity, a wide bandgap, a transparency, and a low resistance. Examples of such a material include a thin film of a metal oxide semiconductor such as zinc oxide (ZnO), a zinc oxide compound containing aluminum, boron, gallium, indium, fluorine or the like, indium tin oxide (ITO) and tin oxide ($SnO_2$). It suffices that the thickness of the upper electrode 5 is approximately 1 to 2 µm. Since the window layer can be considered as one of the electrodes of the photoelectric conversion device 21, the window layer is regarded as the upper electrode 5 in this embodiment. In addition to such a window layer, a transparent conductive film may also be formed as the upper electrode 5.

The connection conductor 7 is a conductor penetrating through the light-absorbing layer 3 and the buffer layer 4 and electrically connecting, in neighboring photoelectric conversion cells, the upper electrode 5 of one photoelectric conversion cell 20 to the lower electrode 2 of the other photoelectric conversion cell 20.

As shown in FIGS. 1 and 2, the connection conductor 7 has a first connection portion A connected to the lower electrode 2 through the first metal-chalcogen compound layer 8a, and a second connection portion B directly connected to the lower electrode 2 without interposition of the first metal-chalcogen compound layer 8a. That is, in this embodiment, the first metal-chalcogen compound layer 8a provided partially on the lower electrode 2 is formed so as to extend from a surface of the lower electrode 2 toward the height direction (Z direction in FIG. 1) of the connection conductor 7 and enter the connection conductor 7. Therefore, in this embodiment, the adhesion between the lower electrode 2 and the connection conductor 7 can be improved due to an anchor effect exerted by the first metal-chalcogen compound layer 8a. Thus, the photoelectric conversion efficiency can be improved.

The thickness and the material of the first metal-chalcogen compound layer 8a may be equivalent to those of the second metal-chalcogen compound layer 8b described above. FIG. 3 is a schematic diagram for explaining the shape of the first metal-chalcogen element 8a. The first metal-chalcogen compound layer 8a is provided on a part of the lower electrode 2 confronting a gap portion C serving as a separating groove P2 which will be described later. In FIG. 3, for the purpose of explaining the shape of the first metal-chalcogen element 8a, the buffer layer 4, the upper electrode 5, a collector electrode 6, and the connection conductor 7 are not shown. As shown in FIG. 3 illustrating the gap portion C as viewed from the lower electrode 2 side, the shape of the first metal-chalcogen element 8a may be a rectangular shape, an oval shape, a circular shape, or the like. The gap portion C is formed by separating the photoelectric conversion layer 33 into two sections, and, for example, has an elongated shape extending along a Y direction as shown in FIG. 3. The first metal-chalcogen compound layer 8a may be formed so as to extend along the longitudinal direction of the gap portion C. This allows the first metal-chalcogen compound layer 8a to be formed larger than a width (length of the gap portion C with respect to the direction perpendicular to the longitudinal direction thereof) of the gap portion C. Thus, the anchor effect can be furthermore improved. In a case where the first metal-chalcogen compound layer 8a has an elongated shape, it may be provided at an end portion along the longitudinal direction of the gap portion C, as shown in FIG. 3. As a result, around this end portion, the photoelectric conversion layer 33 is not easily peeled off from the lower electrode 2.

In this embodiment, it is preferable that the area of the first connection portion A is smaller than the area of the second connection portion B in a plan view of the substrate 1. In other words, in this embodiment, in a plan view of the substrate 1, the area of the first metal-chalcogen compound layer 8a is smaller than the total area of the lower electrode 2 in the gap portion C. At this time, the ratio of the area of the first metal-chalcogen compound 8a to the total area of the lower electrode 2 in the gap portion C is preferably 25% to 45%. Thereby, in this embodiment, while maintaining the above-mentioned anchor effect, a resistance can be lowered by the direct connection between the lower electrode 2 and the connection conductor 7, thus improving the conversion efficiency. Such an area ratio can be measured by using, for example, the Auger electron spectroscopy after the gap portion C is formed. The area ratio may also be measured by the Auger electron spectroscopy when, for example, the first metal-chalcogen compound layer 8a is exposed as a result of removing the connection conductor 7 in the Z direction in FIG. 1.

The connection conductor 7 may be formed by the same material as that of the upper electrode 5, or may be formed by the solidification of a metal paste. Here, the solidification includes, in a case where a binder used in the metal paste is a thermoplastic resin, a solidified state after melting, and also includes, in a case where the binder is a curable resin such as a thermosetting resin or a photo-curable resin, a state after curing. From the viewpoint of a connection reliability, a metal paste obtained by dispersing a powdered metal such as Ag in a resin binder or the like is adoptable.

The collector electrode 6 may be provided on the upper electrode 5. The collector electrode 6 is, for example, formed in a linear shape extending from one end of the photoelectric conversion cell 20 to the connection conductor 7, as shown in FIGS. 1 and 2. As a result, a charge caused by the photoelectric conversion performed by the light-absorbing layer 3 is collected by the collector electrode 6 through the upper electrode 5, and can be successfully conducted to the neighboring photoelectric conversion cell 20 through the connection conductor 7. Thus, providing the collector electrode 6 enables efficient extraction of the charge caused in the light-absorbing layer 3, even if the upper electrode 5 is thin. This consequently improves a power generation efficiency.

From the viewpoint of reducing shielding of light transmission to the light-absorbing layer 3 and also providing a good conductivity, the collector electrode 6 may have a width of 50 to 400 µm. The collector electrode 6 may be branched and have a plurality of branch portions.

The collector electrode 6 can be formed by, for example, pattern-printing a metal paste obtained by dispersing a powdered metal such as Ag in a resin binder or the like, and then drying the metal paste to solidify it.

Next, a method for manufacturing a photoelectric conversion device according to an embodiment of the present invention will be described with reference to FIGS. 4A to 4F and 5A to 5E. Firstly, a method for manufacturing the photoelectric conversion device 21 shown in FIGS. 4A to 4F will be described.

Figure 4A:
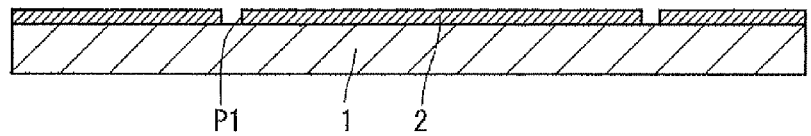
FIGS. 4A to 4F are step-by-step cross-sectional views illustrating an example of an embodiment of a method for producing a photoelectric conversion device according to the present invention.

Firstly, as shown in FIG. 4A, a film of the lower electrode 2 is formed substantially throughout a surface of the washed substrate 1 by using a sputtering method or the like. Then, in the film of the lower electrode 2 thus formed, a dividing groove P1 is formed by using a YAG laser or the like, thus patterning the lower electrode 2.

Figure 4B:
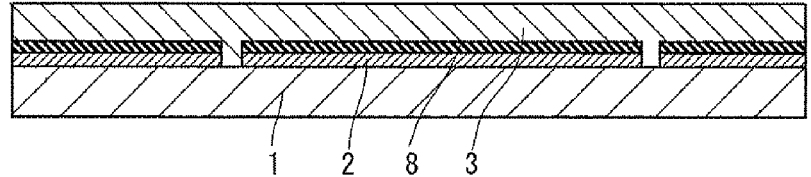

Then, as shown in FIG. 4B, a film of the light-absorbing layer 3 is formed on the patterned lower electrode 2 by using a sputtering method, a vapor-deposition process, a printing process, or the like. At this time, the chalcogen element which is a feedstock of the light-absorbing layer 3 is reacted with the lower electrode 2, to form a metal-chalcogen compound layer 8 (first to third metal-chalcogen compound layers) at an interface between the lower electrode 2 and the light-absorbing layer 3.

Figure 4C:
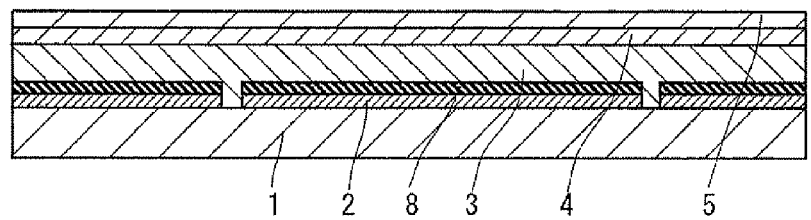

Then, as shown in FIG. 4C, a film of the buffer layer 4 is formed on the light-absorbing layer 3 by using a solution-growth process (CBD method) or the like. Then, a film of the upper electrode 5 is formed on the buffer layer 4 by using a sputtering method, a metal organic chemical vapor deposition (MOCVD method) process, or the like.

Figure 4D:
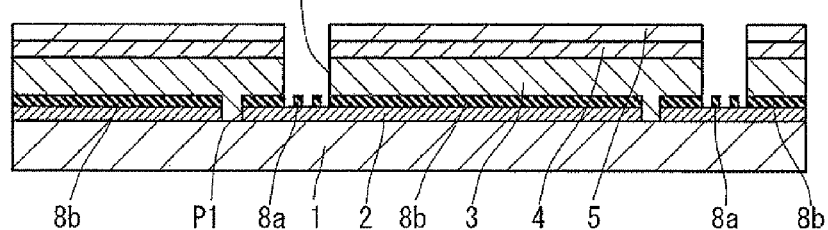

Then, as shown in FIG. 4D, the separating groove P2 (gap portion C) is formed through the light-absorbing layer 3, the buffer layer 4, and the upper electrode 5 by a mechanical scribing process. The separating groove P2 is spaced from the dividing groove P1 formed in the lower electrode 2, at an interval of approximately 0.1 to 1.0 mm, for example. A width of the separating groove P2 is, for example, approximately 100 to 1000 μm. The separating groove P2 having such a width can be formed by sequentially performing scribing several times while shifting the pitch by using a scriber having a scribe width of approximately 40 to 50 μm. Alternatively, the separating groove P2 may be formed by performing scribing using a scriber whose tip end is widened to a predetermined width. Also alternatively, the separating groove P2 may be formed by performing scribing once to several times using two or more scribers that are fixed while being in contact with each other or being close to each other.

In the formation of the separating groove P2, the intensity of the mechanical scribing process is adjusted to partially remove the metal-chalcogen compound layer 8 in the separating groove P2. At this time, a portion of the metal-chalcogen compound layer 8 left on the lower electrode 2 serves as the first metal-chalcogen compound layer 8a. The first metal-chalcogen compound layer 8a constituted by partially leaving the metal-chalcogen compound layer 8 in such a manner can be formed by the following method. For example, in a scribing process, the pressing force and the speed of the scriber may be set at 0.1 to 0.5 MPa and 200 to 2000 mm/sec, respectively. Under such conditions, the force of removing the metal-chalcogen compound layer 8 is weakened, so that the metal-chalcogen compound layer 8 can be left on the lower electrode 2. A portion of the metal-chalcogen compound layer 8 positioned between the lower electrode 2 and the photoelectric conversion layer 33 serves as the second metal-chalcogen compound layer 8b. It is acceptable that a surface part of the lower electrode 2 may also be scraped in the removal of the metal-chalcogen compound layer 8. Thereby, the metal-chalcogen compound layer 8 can be stably removed, and the above-mentioned connection reliability of the second connection portion can be improved. The method for removing the metal-chalcogen compound layer 8 is not limited to the mechanical scribing process, and the removal may be done by an etching process or the like.

Figure 4E:
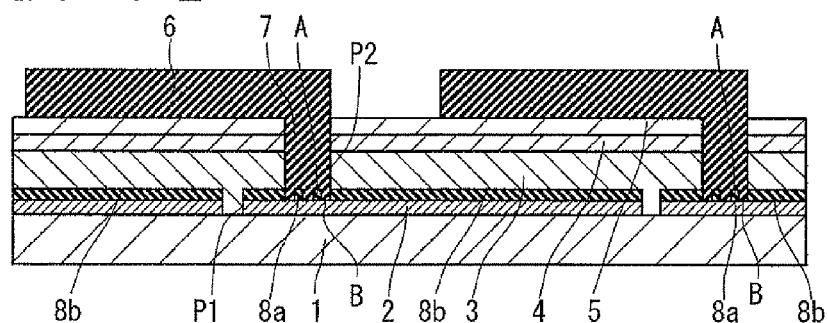

Then, as shown in FIG. 4E, a silver paste or the like is printed on the upper electrode 5 and in the separating groove P2 for the purpose of lowering the resistance, thereby forming the collector electrode 6 and the connection conductor 7. Thus, the first connection portion A where the connection conductor 7 is electrically connected to the lower electrode 2 through the first metal-chalcogen compound layer 8a, and the second connection portion B where the connection conductor 7 is directed connected to the lower electrode 2 without interposition of the first metal-chalcogen compound layer 8a, can be formed in the separating groove P2.

Figure 4F:
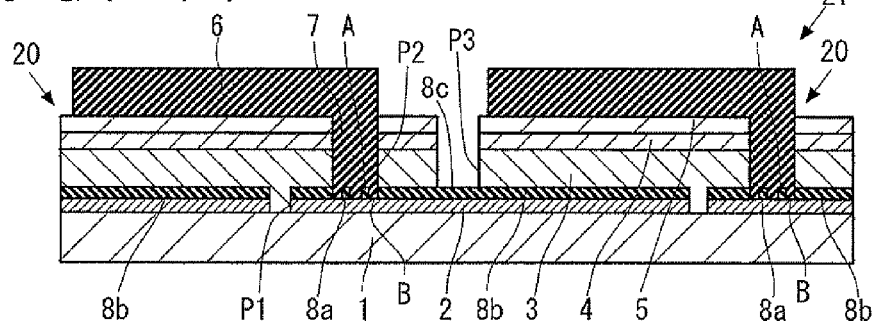

Finally, as shown in FIG. 4F, the light-absorbing layer 3, the buffer layer 4, and the upper electrode 5 are patterned by a mechanical scribing process, to form a separating groove P3, thus forming the photoelectric conversion device 21 having a plurality of photoelectric conversion cells 20 connected in series with one another. In the formation of the separating groove P3, the metal-chalcogen compound layer 8 may be either removed or left. If the metal-chalcogen compound layer 8 is left during the formation of the separating groove P3 to form a third metal-chalcogen compound layer 8c, the lower electrode 2 in the separating groove P3 can be protected by the third metal-chalcogen compound layer 8c. As a result, in this embodiment, occurrence of corrosion of the lower electrode 2 due to an entry of moisture from the outside can be reduced, and therefore a reliability can be improved. If the third metal-chalcogen compound layer 8c is provided so as to fully cover a part of the lower electrode 2 exposed in the separating groove P3, a moisture resistance can be furthermore improved. In a case where the separating groove P3 is formed by the above-mentioned mechanical scribing, it suffices that, for example, the pressing force and the speed of the scriber are set at 0.02 to 0.05 MPa and 100 to 1500 mm/sec, respectively, for providing the third metal-chalcogen compound layer 8c. Under such conditions, the light-absorbing layer 3, the buffer layer 4, and the upper electrode 5 can be removed with the third metal-chalcogen compound layer 8c being left on the lower electrode 2. From the viewpoint of more reliably remove the light-absorbing layer 3, the buffer layer 4, and the upper electrode 5 from the separating groove P3, the speed of the scriber is preferably 100 to 500 mm/sec.

In FIG. 4C, it may be acceptable that, prior to forming the upper electrode 5, only the separating groove P2 is formed by a mechanical scribing process, and then the upper electrode 5 is formed. At this time, the upper electrode 5 may be formed also in the separating groove P2, to serve as the connection conductor 7. It may also be acceptable that the buffer layer 4 and the upper electrode 5 are formed prior to forming the separating groove P2, as shown in FIG. 4C. This enables the upper electrode 5 to be formed while the buffer layer 4 is being in a good state, to obtain a good electrical connection between the buffer layer 4 and the upper electrode 5. Thus, the photoelectric conversion efficiency can be improved. Additionally, the method shown in FIG. 4C can reduce a deterioration of the surface of the buffer layer 4 which may otherwise be caused by scraps resulting from the formation of the separating groove P2.

In this manner, the photoelectric conversion cell 20 having a laminated structure including the substrate 1, the lower electrode 2, the light-absorbing layer 3, the buffer layer 4, and the upper electrode 5 laminated in the mentioned order from the back surface side, is formed. The photoelectric conversion device 21 has a structure in which a plurality of the photoelectric conversion cells 20 are electrically connected and integrated.

Figure 5A:
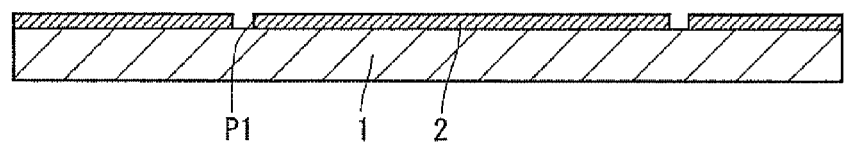
FIGS. 5A to 5E are step-by-step cross-sectional views illustrating another example of the embodiment of a method for producing a photoelectric conversion device according to the present invention.
Figure 5B:
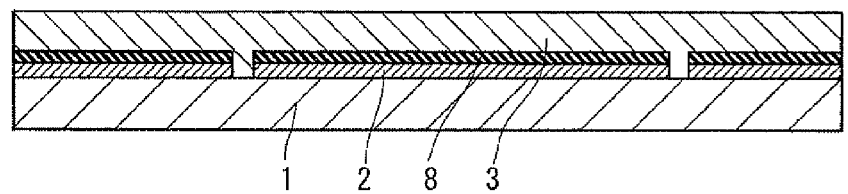
Figure 5C:
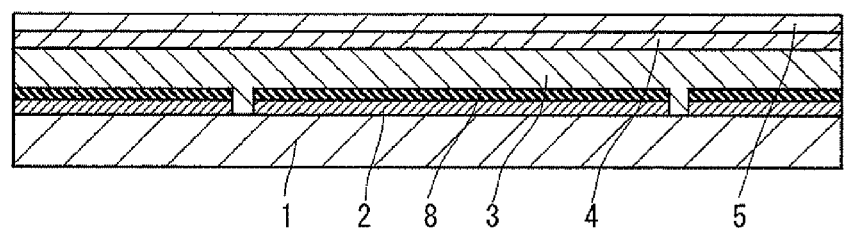
Figure 5D:
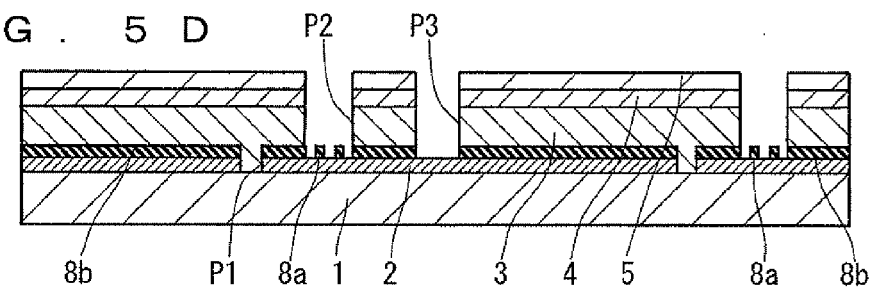
Figure 5E:
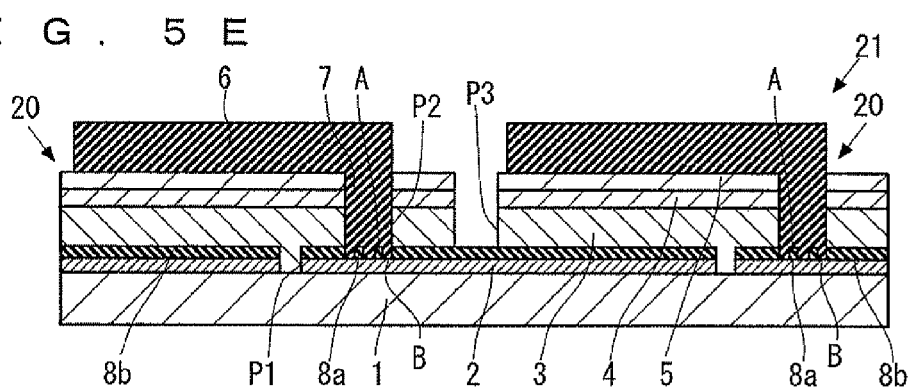

FIGS. 5A to 5E show another embodiment of a method for producing the photoelectric conversion device 21. FIGS. 5A to 5C are identical to FIGS. 4A to 4C. The embodiment shown in FIGS. 5A to 5E are different from the manufacturing method shown in FIGS. 4A to 4F, in that the separating groove P3 is formed simultaneously with the formation of the separating groove P2 in FIG. 5D. In this case, the separating grooves P2 and P3 can be formed in a single step, and therefore the process can be simplified. Then, as shown in FIG. 5E, a metal paste such as a silver paste is printed on the upper electrode 5 and in the separating groove P2 for the purpose of lowering the resistance, thereby forming the collector electrode 6 and the connection conductor 7. At this time, the light-absorbing layer 3 and the buffer layer 4 existing between the separating groove P2 and the separating groove P3 can function as a protective barrier for making it difficult for the metal paste to wetly spread into contact with the neighboring photoelectric conversion cell 20.

In this method for producing the photoelectric conversion device 21, the separating groove P2 for providing the connection conductor 7 and the separating groove P3 for separating the photoelectric conversion cells 20 from each other are formed in a single step, and then the connection conductor 7 is formed in the separating groove P2 by using the metal paste. Therefore, such a manufacturing method can simplify the process.

Figure 6:
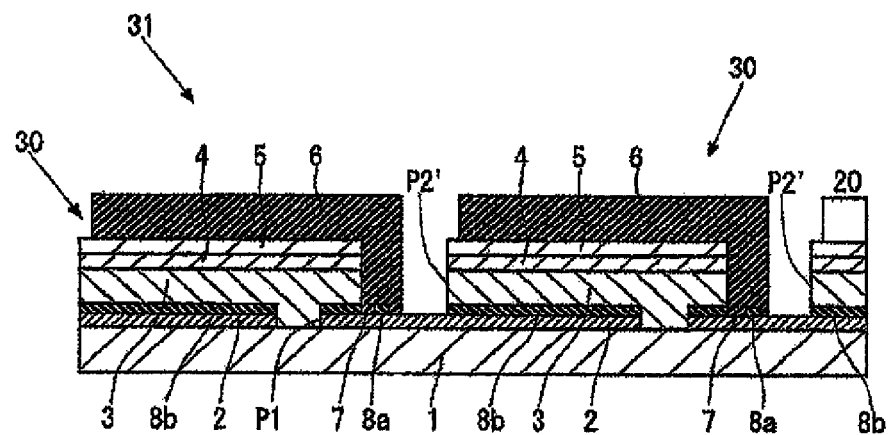
FIG. 6 is a cross-sectional view illustrating another example of the embodiment of a photoelectric conversion device according to the present invention.

Next, another embodiment of a structure of a photoelectric conversion device according to the present invention will be described. The photoelectric conversion device 31 shown in FIG. 6 is different from the photoelectric conversion device 21 shown in FIGS. 1 and 2, in that the separating groove for separating both of the light-absorbing layer 3 and buffer layer 4 is formed as a single separating groove P2'. The same configurations as those of the photoelectric conversion device 21 are denoted by the common corresponding reference numerals. The photoelectric conversion device 31 is configured such that the connection conductor 7 is not in contact with the neighboring photoelectric conversion cell 30 within the separating groove P2'. Thus, the step of forming the separating groove P3 can be omitted, and the process can be simplified.

The connection conductor 7 is formed by providing a metal paste in the separating groove P2' such that the metal paste can cover substantially half of the separating groove P2'. A metal paste having an appropriate degree of viscosity may be used as the metal paste in order to prevent the metal paste applied in the separating groove P2' from flowing into contact with the neighboring photoelectric conversion cell 30.

Figure 7:
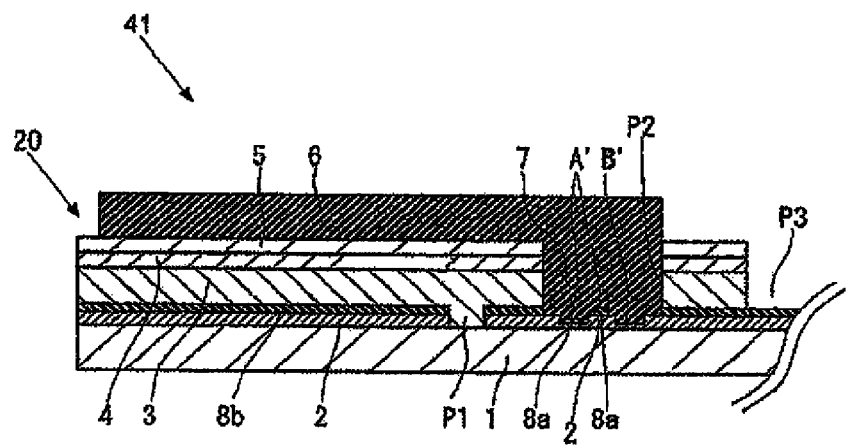
FIG. 7 is a partially enlarged cross-sectional view illustrating another example of the embodiment of a photoelectric conversion device according to the present invention.

A photoelectric conversion device 41 shown in FIG. 7 is different from the photoelectric conversion device 21 shown in FIGS. 1 and 2, in that recesses are formed in a portion of the surface of the lower electrode 2 exposed in the separating groove P2' that corresponds to the gap portion C. The same configurations as those of the photoelectric conversion device 21 are denoted by the common corresponding reference numerals. In the photoelectric conversion device 41, a first connection portion A' and a second connection portion B' are positioned within the recesses. In the photoelectric conversion device 41 in which the first connection portion A' and the second connection portion B' are positioned within the recesses in this manner, the anchor effect of the connection conductor 7 can be furthermore improved, so that the adhesion between the lower electrode 2 and the connection conductor 7 can be improved. Moreover, in the photoelectric conversion device 41, the connection conductor 7 is connected also to inner side surfaces of the recesses, thus reducing a contact resistance. As a result, in this embodiment, an extracted current can be increased, and therefore the conversion efficiency can be improved.

The present invention is not limited to the above-described embodiments, and various modifications can be made without departing from the essence of the present invention.

DESCRIPTION OF THE REFERENCE NUMERALS

1: substrate
2: lower electrode
3: light-absorbing layer
33: photoelectric conversion layer
4: buffer layer
5: upper electrode
6: collector electrode
7: connection conductor
8: metal-chalcogen compound layer
8a: first metal-chalcogen compound layer
8b: second metal-chalcogen compound layer
8c: third metal-chalcogen compound layer
20, 30, 40: photoelectric conversion cell
21, 31, 41: photoelectric conversion device

The invention claimed is:

1. A photoelectric conversion device comprising:
a substrate;
a plurality of photoelectric conversion cells located on the substrate, respectively, each of the photoelectric conversion cells comprising
a lower electrode on the substrate comprising a metal element,
a photoelectric conversion layer comprising a chalcogen compound semiconductor, the photoelectric conversion layer being located on the lower electrode, and
an upper electrode located on the photoelectric conversion layer,
a connection conductor electrically connecting, in neighboring ones of the photoelectric conversion cells, the upper electrode of one photoelectric conversion cell to the lower electrode of the other photoelectric conversion cell; and
a first metal-chalcogen compound layer between the lower electrode and the connection conductor comprising the metal element and a chalcogen element included in the chalcogen compound semiconductor,
wherein the connection conductor comprises a first connection portion and a second connection portion, the first connection portion being connected to the lower electrode through the first metal-chalcogen compound, the second connection portion being connected to the lower electrode of the neighboring photoelectric conversion cell without interposition of the first metal-chalcogen compound layer, the first connection portion and the second connection portion being located on an upper surface of the lower electrode.

2. The photoelectric conversion device according to claim 1, wherein the connection conductor is a solidification of a metal paste.

3. The photoelectric conversion device according to claim 1, wherein a collector electrode connected to the connection conductor is located on the upper electrode.

4. The photoelectric conversion device according to claim 1, wherein in a plan view of the substrate, the area of the first connection portion is smaller than the area of the second connection portion.

5. The photoelectric conversion device according to claim 1, further comprising
a second metal-chalcogen compound layer between the lower electrode and the photoelectric conversion layer comprising the metal element and the chalcogen element.

6. The photoelectric conversion device according to claim 1, wherein the lower electrode has a recess in a surface thereof at the connection conductor side, and at least one of the first connection portion and the second connection portion is located in the recess.

7. The photoelectric conversion device according to claim 1, wherein a third metal-chalcogen compound layer comprising the metal element and the chalcogen element is further provided on a surface at the side opposite to the substrate of the lower electrode located between neighboring ones of the photoelectric conversion cells.

8. The photoelectric conversion device according to any claim 1, wherein
the connection conductor is located on an elongated gap portion located in the photoelectric conversion layer,
the first metal-chalcogen compound layer is located so as to extend along a longitudinal direction of the gap portion.

9. The photoelectric conversion device according to claim 8, wherein the first metal-chalcogen compound layer is located at an end portion of the elongated gap portion with respect to the longitudinal direction thereof.

* * * * *